(12) United States Patent
Ali et al.

(10) Patent No.: US 7,747,237 B2
(45) Date of Patent: Jun. 29, 2010

(54) HIGH AGILITY FREQUENCY SYNTHESIZER PHASE-LOCKED LOOP

(75) Inventors: Akbar Ali, Garden Grove, CA (US); James P. Young, Cedar Rapids, IA (US)

(73) Assignee: Skyworks Solutions, Inc., Woburn, MA (US)

( * ) Notice: Subject to any disclaimer, the term of this patent is extended or adjusted under 35 U.S.C. 154(b) by 1123 days.

(21) Appl. No.: 10/821,531

(22) Filed: Apr. 9, 2004

(65) Prior Publication Data

US 2005/0227629 A1    Oct. 13, 2005

(51) Int. Cl.
    *H04B 1/06*     (2006.01)
    *H04B 7/00*     (2006.01)
(52) U.S. Cl. ............... 455/260; 455/265; 455/266; 455/183.2; 455/264; 331/2; 331/49
(58) Field of Classification Search ............ 455/76, 455/183.1–187.1, 255–266; 331/2, 46–52
See application file for complete search history.

(56) References Cited

U.S. PATENT DOCUMENTS

| | | | | | |
|---|---|---|---|---|---|
| 3,899,746 | A | * | 8/1975 | Gammel | 331/2 |
| 4,361,906 | A | * | 11/1982 | Sakamoto | 455/140 |
| 4,629,999 | A | * | 12/1986 | Hatch et al. | 331/1 R |
| 4,654,884 | A | * | 3/1987 | Sakai et al. | 455/183.2 |
| 4,659,999 | A | * | 4/1987 | Motoyama et al. | 331/2 |
| 4,896,122 | A | * | 1/1990 | Tahernia et al. | 331/158 |
| 5,038,404 | A | * | 8/1991 | Marz | 455/118 |
| 5,053,722 | A | * | 10/1991 | Kuo et al. | 331/2 |
| 5,140,284 | A | * | 8/1992 | Petersson et al. | 331/25 |
| 5,160,902 | A | * | 11/1992 | Saeki et al. | 331/117 R |
| 5,237,291 | A | * | 8/1993 | Hjipieris et al. | 331/2 |
| 5,270,669 | A | * | 12/1993 | Jokura | 331/2 |

(Continued)

FOREIGN PATENT DOCUMENTS

JP     06-338793     12/1994

(Continued)

OTHER PUBLICATIONS

Tony van Roon, "Phase-Locked Loops Tutorial", Copyright © 2001, Last update: Jun. 4, 2003, pp. 1-11.

(Continued)

*Primary Examiner*—Edward Urban
*Assistant Examiner*—RuiMeng Hu
(74) *Attorney, Agent, or Firm*—Weide & Miller, Ltd.

(57) ABSTRACT

A highly agile low phase noise frequency synthesizer is provided for rapid generation of frequency specific signals. The frequency synthesizer is capable of rapidly generating signals at different output frequencies while maintaining low cross-coupling. Two or more signal generators utilize a reference frequency to generate two or more signals. These signals are limit processed to reduce cross-coupling prior to being presented to a switch. Responsive to a control signal, the switch outputs one of the signals to a frequency modification device, such as a frequency divider or multiplier. Responsive to a control signal, the frequency modification device scales the frequency of the switch output to convert the frequency of the switch output signal to a desired output frequency. By maintaining sufficient frequency separation between the switch input signals cross-coupling and phase noise is minimized and implementation on an integrated circuit may be achieved.

27 Claims, 8 Drawing Sheets

U.S. PATENT DOCUMENTS

| | | | | |
|---|---|---|---|---|
| 5,319,798 | A * | 6/1994 | Watanabe | 455/76 |
| 5,332,978 | A * | 7/1994 | Yabuki et al. | 331/2 |
| 5,408,201 | A * | 4/1995 | Uriya | 331/2 |
| 5,434,888 | A * | 7/1995 | Fukuchi | 375/307 |
| 5,452,290 | A * | 9/1995 | Mihm, Jr. | 370/436 |
| 5,497,128 | A * | 3/1996 | Sasaki | 331/38 |
| 5,498,998 | A * | 3/1996 | Gehrke et al. | 331/17 |
| 5,535,247 | A * | 7/1996 | Gailus et al. | 375/297 |
| 5,610,558 | A * | 3/1997 | Mittel et al. | 331/2 |
| 5,686,864 | A * | 11/1997 | Martin et al. | 331/1 A |
| 5,825,813 | A * | 10/1998 | Na | 375/219 |
| 6,005,446 | A * | 12/1999 | Galani et al. | 331/41 |
| 6,061,575 | A * | 5/2000 | Lombardi | 455/552.1 |
| 6,163,223 | A * | 12/2000 | Kapetanic et al. | 331/2 |
| 6,229,399 | B1 * | 5/2001 | Tobise et al. | 331/17 |
| 6,321,074 | B1 * | 11/2001 | Lemay | 455/260 |
| 6,337,600 | B1 * | 1/2002 | Shigemori et al. | 331/16 |
| 6,343,221 | B1 * | 1/2002 | Toda et al. | 455/553.1 |
| 6,411,660 | B1 * | 6/2002 | Oh | 375/327 |
| 6,433,630 | B1 * | 8/2002 | Isoda | 329/307 |
| 6,441,692 | B1 * | 8/2002 | Nakatani et al. | 331/42 |
| 6,509,770 | B2 | 1/2003 | Gossmann et al. | |
| 6,570,948 | B1 * | 5/2003 | Marshall | 375/376 |
| 6,756,863 | B2 * | 6/2004 | Oita | 333/133 |
| 6,763,474 | B1 * | 7/2004 | Boerstler et al. | 713/400 |
| 6,766,178 | B1 * | 7/2004 | Damgaard et al. | 455/552.1 |
| 6,822,519 | B1 * | 11/2004 | Moreland et al. | 331/16 |
| 6,828,863 | B2 * | 12/2004 | Itkin et al. | 331/2 |
| 6,829,469 | B1 * | 12/2004 | Henriksson | 455/76 |
| 6,842,077 | B2 * | 1/2005 | Oga | 331/46 |
| 6,845,462 | B2 * | 1/2005 | Yatsuda et al. | 713/501 |
| 7,003,274 | B1 * | 2/2006 | Olip | 455/260 |
| 7,006,590 | B2 * | 2/2006 | Skierszkan et al. | 375/376 |
| 7,023,485 | B1 * | 4/2006 | Sohn | 348/441 |
| 7,088,155 | B2 * | 8/2006 | Takahashi | 327/144 |
| 7,109,803 | B2 * | 9/2006 | Rebel | 331/2 |
| 7,158,603 | B2 * | 1/2007 | Sofianos et al. | 375/376 |
| 7,215,214 | B1 * | 5/2007 | Taheri et al. | 331/107 A |
| 7,602,253 | B2 * | 10/2009 | Kim et al. | 331/2 |
| 2002/0008585 | A1 * | 1/2002 | Welland | 331/2 |
| 2002/0039894 | A1 * | 4/2002 | Yoshida et al. | 455/265 |
| 2002/0055344 | A1 * | 5/2002 | Shimoda | 455/260 |
| 2002/0127988 | A1 * | 9/2002 | Humes et al. | 455/260 |
| 2002/0145457 | A1 * | 10/2002 | Sumi | 327/159 |
| 2002/0171511 | A1 * | 11/2002 | Oita | 333/193 |
| 2004/0012447 | A1 * | 1/2004 | Nagaishi et al. | 331/2 |
| 2004/0080373 | A1 * | 4/2004 | Clarke | 331/25 |
| 2004/0087279 | A1 * | 5/2004 | Muschallik et al. | 455/73 |
| 2004/0101081 | A1 | 5/2004 | Hsu | |
| 2004/0106386 | A1 * | 6/2004 | Doi | 455/165.1 |
| 2004/0130401 | A1 * | 7/2004 | Ikarashi | 331/74 |
| 2005/0245223 | A1 * | 11/2005 | Wego et al. | 455/265 |
| 2006/0097796 | A1 * | 5/2006 | Gomez | 331/16 |
| 2006/0234649 | A1 * | 10/2006 | Okada | 455/76 |

FOREIGN PATENT DOCUMENTS

| | | |
|---|---|---|
| JP | 06338793 A * | 12/1994 |
| WO | WO 02/076009 | 9/2002 |

OTHER PUBLICATIONS

Ron Bertrand, "Supplementary Reading for 27—Oscillators—The Basics of PLL Frequency Synthesis", Online Radio & Electronics Course, Copyright © 1999-2002, Last revision: Apr. 2002, pp. 1-9.

"Technical Brief SWRA029—Fractional/Integer-N PLL Basics", Texas Instruments Wireless Communication Business Unit, Aug. 1999, pp. 1-9 and 23-35.

Daniel Abramovitch, "Phase-Locked Loops: A Control Centric Tutorial", Agilent Laboratories, 2002 , pp. 1-15.

Danny Abramovitch, "Phase-Locked Loops: A Control Centric Tutorial", Agilent Laborities, May 8, 2002, pp. 1-20 and 31-34.

* cited by examiner

HIGH AGILITY FREQUENCY SYNTHESIZER PHASE-LOCKED LOOP

FIELD OF THE INVENTION

The invention relates to communication systems and circuits, and in particular to a method and apparatus for rapid generation of frequency specific signals.

RELATED ART

To obtain the desired information during reception of a signal, communication devices often isolate a signal which is located at a particular frequency. Likewise, during transmission of a signal, a communication device may utilize one or more signals at precise frequencies to modulate the outgoing signals to a desired carrier frequency. These are but a few of the numerous communication operations and signal processing tasks that rely on generation and use of a signal at a precise frequency.

In addition, modern communication devices often utilize numerous signals at different frequencies. For example, code hopping communication protocols often shift or change the frequency of the signal. Other instances, when it may be necessary to utilize a different frequency, are when changing communication channels due to channel problems or when switching between cellular base station sites during travel. Systems other than communication systems must also generate and use signals at precise frequencies to achieve operation. Hence, there exists a need in the art for a method and apparatus to synthesize signals of a specific frequency.

One example environment where such a need exists is in a communication transmitter and communication receiver. In such an environment a mixer or other device may utilize a signal at a particular frequency as a tuning signal to isolate a desired signal from among numerous signal components in a received signal. Other applications also exist, which would be understood by one of ordinary skill in the art, where it is helpful or necessary to rapidly generate a signal at a precise frequency.

A phase-locked loop is often used to generate a signal at a particular frequency. A phase-locked loop, in its most basic form, comprises a closed loop frequency control circuit which detects a phase difference between input and output signals to control an oscillator, such as for example, a voltage controlled oscillator. While these circuits worked well in prior art communication systems, the demands of modern communication devices, and the communication protocols employed, have strained the capability of traditional frequency generating circuits. For example, communication protocols or standards often demand rapid switching between signal frequencies or use of multiple signals at different frequencies.

One drawback revealed by prior art signal generation systems, for a given cost target, is an inability to rapidly generate signals at different frequencies, i.e. change a signal's frequency, even when the frequencies are relatively close. As outlined above, traditional phase-locked loops (PLL) are indeed control loops that generate a signal with a loop frequency that approaches a desired frequency over time. As such, the time constant of the loop controls the rate of change and thus, the ability of PLL to quickly change frequency. Prior art PLL circuits are simply unable to rapidly change the frequency of their output signals, even when the change in frequency is quite small. An undesirably slow rate of change of a PLL can be a significant disadvantage and result in inoperability with certain systems.

One proposed solution is to utilize more than one PLL within a device. This proposed solution, however, also has drawbacks. One such drawback is that two or more PLLs create interference, such as EMI, that cross contaminate the synthesized signals. This generates undesirable spurious tones and phase noise, or generation of spurious signals that can result in the generated signals being unusable by precision oriented communication transceivers.

One proposed solution has been to construct the PLL with highly precise, but expensive, discrete modular components. The resulting device requires shielding to protect the components from the EMI. While this solution has been widely adopted, it increases the cost of the signal generating systems. Moreover, the size and complexity of the signal generation system is increased as are the number of circuit board traces required for implementation. As is generally understood, an implementation utilizing discrete components located in an EMI shielded enclosure is not a desirable solution to a prior art problem in the electronic arts.

Thus, there is an unsatisfied need in the art for a method and apparatus to generate a highly agile, low phase noise, frequency specific, signal synthesizer.

SUMMARY

A highly agile low phase noise frequency synthesizer is disclosed. As an advantage over the prior art, the frequency synthesizer disclosed herein is capable of rapidly generating signals at different output frequencies while maintaining low cross-coupling. In one embodiment two or more signal generators utilize a reference frequency to generate two or more signals which are provided to a switch. The system switches between these signals to rapidly output a signal at a desired frequency.

These signals may be optionally processed or sent through a limiter, or buffer, or both, to reduce cross-coupling prior to being presented to the switch. Responsive to a control signal the switch outputs one of the signals to a frequency modification device, such as for example a frequency divider or multiplier. In addition, it is contemplated that the limiter or buffer may be located after the switch. Responsive to a control signal, the frequency modification device scales the frequency of the switch output to convert the frequency of the switch output to a desired output frequency. A controller, such as a processor, digital signal processor, or control logic for example may generate the control signals. The control signals synchronize operation of the switch and the frequency modification device to apply the proper degree of frequency modification based upon which input signal is output by the switch. By maintaining sufficient frequency separation between the switch input signals cross-coupling and phase noise is minimized and implementation on an integrated circuit may be achieved.

In one embodiment a method is provided for rapidly generating a signal at an output frequency for use in a communication device. This method comprises providing a reference signal at a reference frequency to a first signal synthesizer configured to generate a first signal at a first frequency and then generating the first signal with the first signal synthesizer. This signal may be limit processed or passed through a buffer to reduce harmonic cross-coupling to thereby create a processed first signal. This method also provides the reference signal at the reference frequency to a second signal synthesizer configured to generate a second signal at a second frequency. The second signal may then be limit processed or passed through a buffer to reduce harmonic cross-coupling thereby creating a processed second signal.

The processed first signal and the processed second signal are provided to a switch which, responsive to a control signal, selectively outputs either the processed first signal or the processed second signal. The method then, responsive to a control signal, selectively divides or multiplies the frequency of the signal output from the switch to thereby rapidly generate a frequency specific signal for use in a communication device.

In one embodiment the first signal synthesizer and the second signal synthesizer comprise phase locked loops. In one embodiment limit processing comprises converting a sinusoidal signal to a signal more closely resembling a square wave signal. It is contemplated that dividing, multiplying, or shifting may comprise modifying the frequency of the signal output from the switch in proportion to the ratio of the output frequency to either the first frequency or the second frequency.

This method may further comprise utilizing one or more additional signal synthesizers to generate one or more additional signals at one or more additional frequencies. It is contemplated that the first signal synthesizer and the second signal synthesizer may also generate signals at frequencies in addition to the first frequency and the second frequency.

Also disclosed herein is a method for generating an output signal at one or more output frequencies by generating a first signal at a first frequency and generating a second signal at a second frequency. This method then provides the first signal and the second signal to a switch which selectively outputs either the first signal or the second signal from the switch to a frequency modification module. The frequency modification module selectively modifies the frequency of the first signal, the second signal, or both and then outputs the first signal or a frequency modified first signal during a first time period and outputs the second signal or a frequency modified second signal during a second time period. In this manner, signals of different frequencies may be output and rapid shifting or switching between signals may occur.

In one embodiment, the first frequency and the second frequency are non-integer multiples to reduce cross-coupling in the switch and in the circuit in general. It is also contemplated that the method may further comprise performing a limiting function on at least the first signal or the second signal to reduce cross-coupling and the limiting function may comprise converting a sinusoidal signal to a square wave signal. Alternatively or in addition, the first signal or the second signal, or both may pass through a buffer.

In one embodiment the frequency modification module does not modify the frequency of both the first signal and the second signal. In one embodiment the frequency modification module may modify the frequency of the first signal by an amount different than the amount of modification to the frequency of the second signal.

Also disclosed herein is a system for generating an output signal, wherein the output signal is capable of switching between two or more output frequencies. In one embodiment the system comprises two or more signal generators configured to generate two or more signals, such that each signal is at a different frequency. Also included is a switch configured to receive at least two signals of the two or more signals and, responsive to a control signal, output a switch output comprising one of the two or more signals. A frequency modification device receives the switch output and modifies the frequency of the switch output to a desired output frequency.

In one embodiment the two or more signal generators generate signals that are at frequencies that are non-integer multiples. Thus, the two or more signals are selected to minimize cross-coupling between the two or more signals. The system may further comprise a controller configured to generate one or more control signals wherein the control signals synchronize switch output with frequency modification device operation.

It is further contemplated that the system may further comprise a limiter or buffer configured to modify the two or more signals prior to switching to reduce cross-coupling between the two or more signals within the switch. For example, the two or more signals generated by the two or more signal generators may comprise non-square wave signals and the limiter may be configured to convert a signal to a format more closely approaching a square wave signal. In one embodiment, a buffer is utilized before the switch to reduce cross-coupling while a limiter may be utilized after the switch. In such an embodiment, placing the limiter after the switch does not introduce harmonics or mixing products. In one example environment, the output signal is for use as a local oscillator signal in a wireless communication device.

In one embodiment a system is provided for rapidly switching the frequency of an output signal between a third frequency and a fourth frequency. This embodiment comprises a switch configured to receive a first signal at a first frequency and a second signal at a second frequency and responsive to a control signal output either the first signal or the second signal. A frequency modification device is configured to receive the switch output and, responsive to a control signal, increase or decrease the frequency of the switch output to either the third frequency or the fourth frequency. To oversee operation and synchronize the switch output with the amount of frequency modification, a controller is configured to provide a control signal to the switch and the frequency modification device. In one embodiment, the frequency modification device comprises a frequency multiplier configured to multiply, divide, or shift a received signal by a value necessary to modify the frequency of the received signal to either the third frequency or the fourth frequency.

One or more limiters or buffers may be added to the system and configured to modify at least one input to the switch to thereby reduce cross-coupling between the first signal and the second signal. Although the first frequency and the second frequency are selected to reduce cross-coupling between signals, the limiter or buffer will further reduce coupling. Because of these cross-coupling mitigation techniques, the system may be embodied in an integrated circuit.

In one embodiment the system further comprises at least one signal generator configured to generate the first signal, the second signal, or both, and the controller is further configured to provide a control signal to at least one signal generator to control which frequency is generated. In this manner, a signal generator may selectively generate a signal that may be controlled to be at different frequencies.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The components in the figures are not necessarily to scale, emphasis instead being placed upon illustrating the principles of the invention. In the figures, like reference numerals designate corresponding parts throughout the different views.

DETAILED DESCRIPTION

Figure 1:
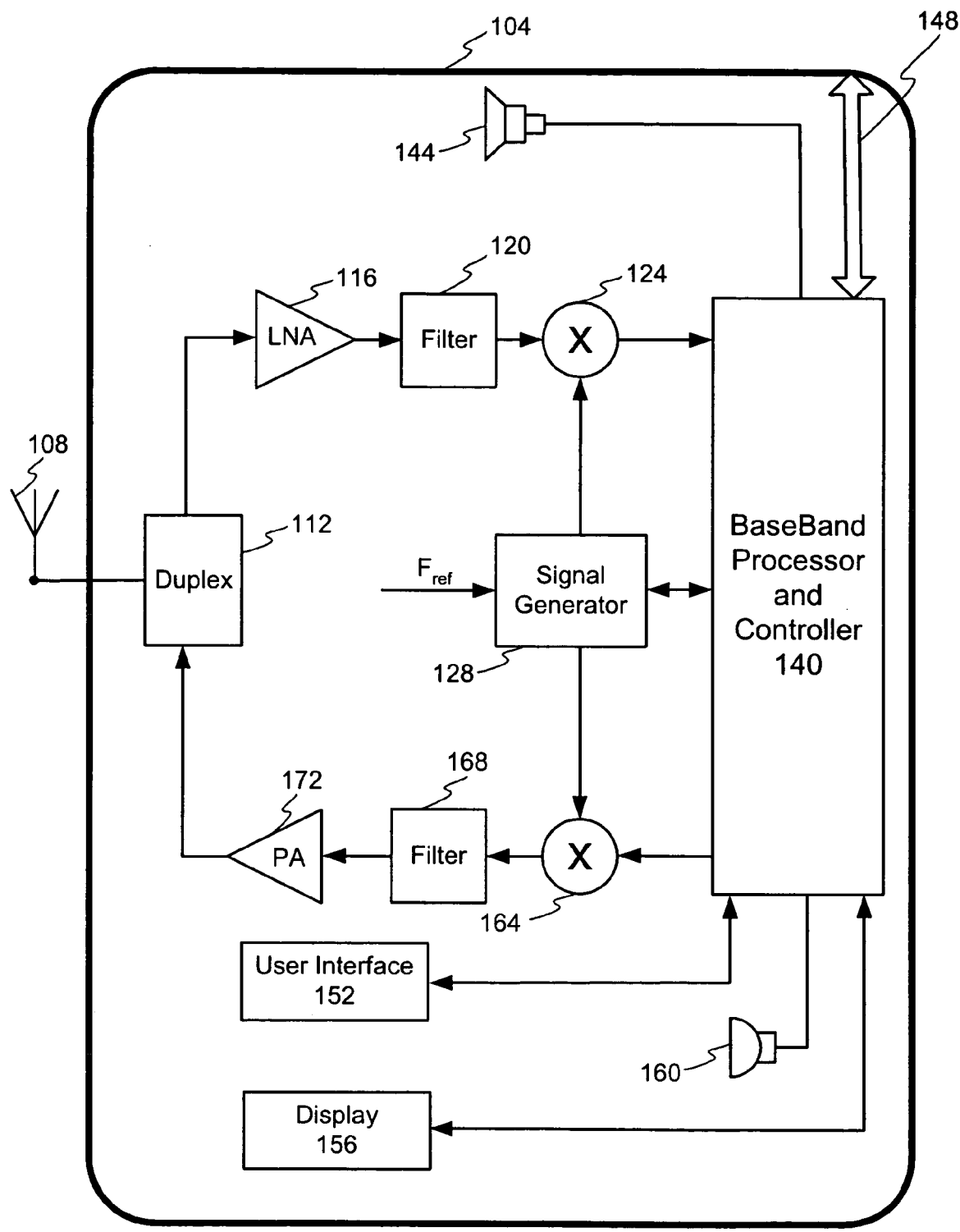
FIG. 1 illustrates a block diagram of a first example environment of use of the invention.

FIG. 1 illustrates a block diagram of a first example environment of use of the invention. The example environment shown in FIG. 1 comprises a wireless communication device but it is noted that this is but one possible example environment of use. It is contemplated that the invention may find use and benefit in numerous other environments both in the communication field and other fields of use.

The embodiment of a wireless communication device shown in FIG. 1 comprises an outer housing 104 configured to protect and selectively enclose the internal electronic apparatus. An antenna 108 receives incoming signals and transmits outgoing signals. The antenna 108 may be located inside or outside of the housing 104. A duplexer 112 connects to the antenna 108 to route incoming signals to a receiver apparatus, shown as the upper path from the duplexer 112 and route outgoing signals to the antenna.

The duplexer 112 connects to a receiver apparatus to hereby route received signals to a low noise amplifier (LNA) 116 that is configured to increase the signal power level for a particular frequency band to a level appropriate for processing by subsequent apparatus. The LNA 116 output connects to a filter 120 which may be configured to perform additional filtering or processing, such as for example band pass filtering or processing to mitigate the effects of the wireless channel.

After filtering, a mixer 124, also known as a down-converter, processes the received signal in conjunction with a signal from a signal generator 128. The mixer may be configured to extract a baseband signal by multiplying the received signal at a carrier frequency $F_{C1}$ with a signal from the signal generator that is also at the carrier frequency $F_{C1}$. As is well understood, the mixer 124 outputs the desired baseband signal.

The output from the mixer 124 feeds into a baseband processor and controller 140 that is configured to receive and process the incoming baseband signal. In one embodiment the baseband processor and controller 140 converts the incoming signal to a digital format, processes the digital signal, and then creates an analog signal which is provided to a speaker 144. Alternatively the digital signal may be provided directly to a data port 148. In this embodiment the baseband processor and controller 140 is in communication with the signal generator 128 to synchronize operation.

The baseband processor and controller 140 is also configured to communicate data to and from a user interface 152, such as one or more keys or buttons, and a display 156 configured to display text, graphics, or other information to a user.

To perform transmission to outgoing signals, the baseband processor and controller 140 may receive a signal from a microphone 160 or digital data from the data port 148. Upon receipt of an outgoing signal, the baseband processor and controller 140 processes the outgoing information to a baseband signal and outputs this baseband signal to a mixer 164, which may also be referred to as an up-converter. The mixer 164 multiplies the baseband signal with an input from the signal generator 128 at the desired carrier frequency $F_{C2}$, which may or may not be identical to $F_{C1}$. The resulting outgoing signal comprises the baseband signal modulated to the carrier frequency and is ready for filtering and processing by the filter 168 and then amplification by a power amplifier 172 to a power level suitable for transmission by the antenna 108 after passing through the duplexer 112.

It should be noted that the signals $F_{C1}$ and $F_{C2}$ may be relatively close in frequency. Likewise, if it is required to change $F_{C1}$ to $F'_{C1}$, such as to change communication channels, i.e. frequency, it is contemplated that these frequencies may also be close. For example, $F_{C1}$ and $F'_{C1}$ may be within 6 MHz. In another embodiment it may be desired to have $F_{C1}$ to $F'_{C1}$ within 30 kHz. These values and ratios are provided for purposes of discussion and to aid in understanding the invention. It is contemplated that these frequencies may be dependant on the particular communication standard in use and hence the claims that follow are not limited to these frequencies.

In many situations it may be necessary to rapidly change the frequency of signals output from the signal generator 128. Examples of situations when a change in a mixer input signal may be desirable include when changing channels in a multiple channel communication system, when changing between base stations or other situations when moving to a different carrier frequency for a transmitted signal or receiving is necessary or desired. To accurately and rapidly synchronize the transmitter or receiver systems to the new frequency it may be necessary for the signal generator to rapidly generate a low noise, highly accurate signal at the desired frequency. In addition, the signal generator should not generate unwanted electromagnetic interference (EMI) or be undesirably complex or expensive to fabricate. Thus, the signal output from the signal generator 128 should be free from cross-coupling. The term cross-coupling as used herein is defined to mean cross-contamination between signals, such as may occur between signals within a communication device. Cross coupling may comprise but is not limited to phase noise, EMI, cross-talk, inter-modulation distortion, spurious degradations, and spurious noise.

Figure 2:
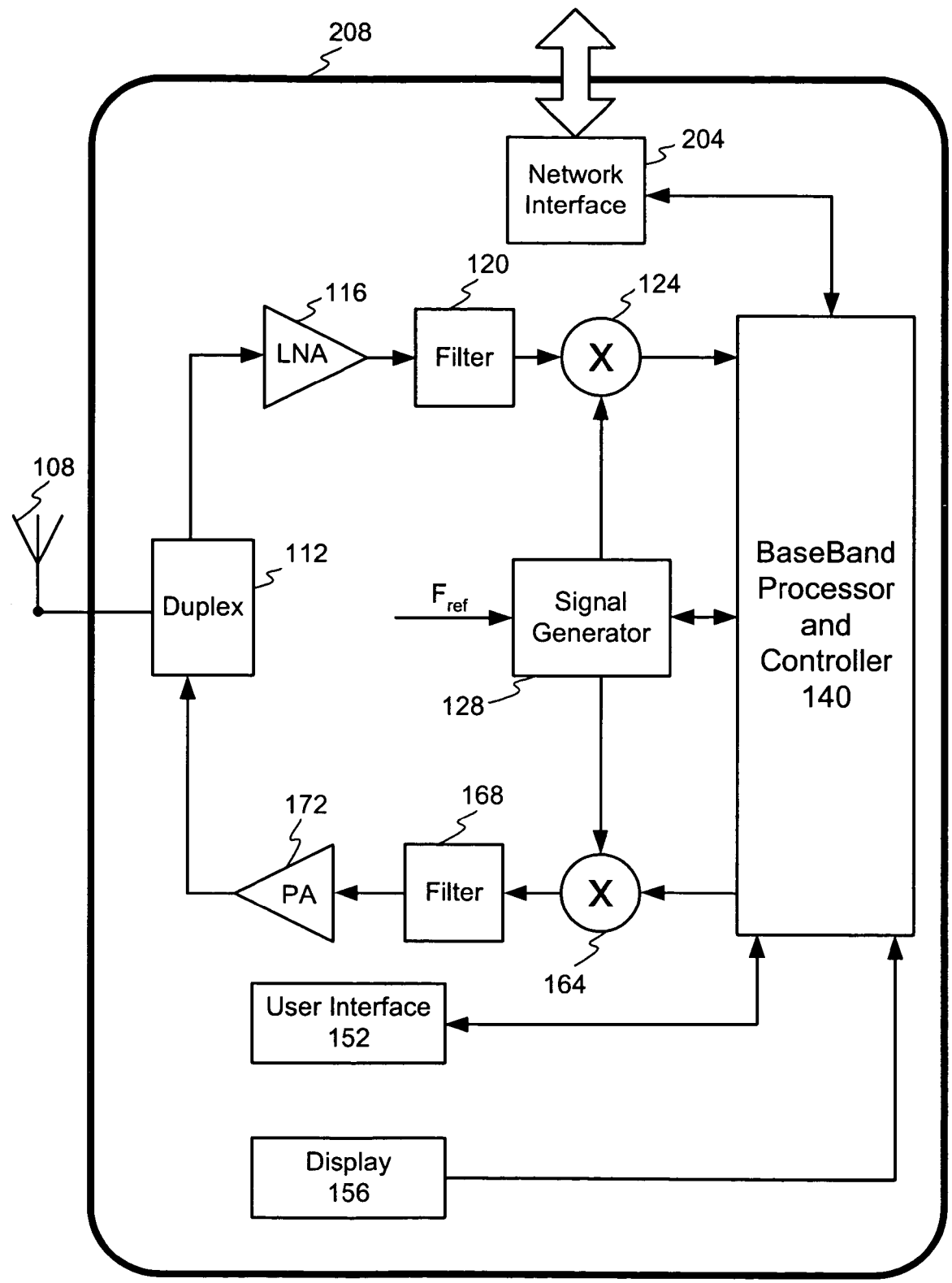
FIG. 2 illustrates a block diagram of a second example environment of use of the invention.

FIG. 2 illustrates a block diagram of second example environment of use of the invention. FIG. 2 shares numerous similarities with FIG. 1 and thus only the aspects that differ from FIG. 1 are discussed in detail. FIG. 2 is directed to a base station 208 or non-mobile communication device configured to communicate with one or more other communication devices. In this configuration, which may represent a base station communication system 208, the baseband processor and controller 140 communicate with a network interface 204. The network interface 204 may be configured to receive one or more signals or packet-based-data from the processor and controller 140. The one or more signals or packet-based-data is output to a computer network, internet, PSTN, or other medium that interfaces with a telephone network, data network, or cellular communication system. When configured as a base station 208, the system shown in FIG. 2 facilitates completion of a mobile telephone call, such as for example a telephone call from a cell phone to a land line. These calls are often completed via the network interface 204 of the base station 208.

As described above in conjunction with FIG. 1, base stations must often change channels which requires that the frequency of a signal within a transceiver be matched or related to the carrier frequency of the incoming signal. Moreover, as a cell phone moves into a base station's coverage area, the base station must dynamically react to the incoming devices by accurately and quickly generating a signal at the selected frequency to accept the active call.

Figure 3:
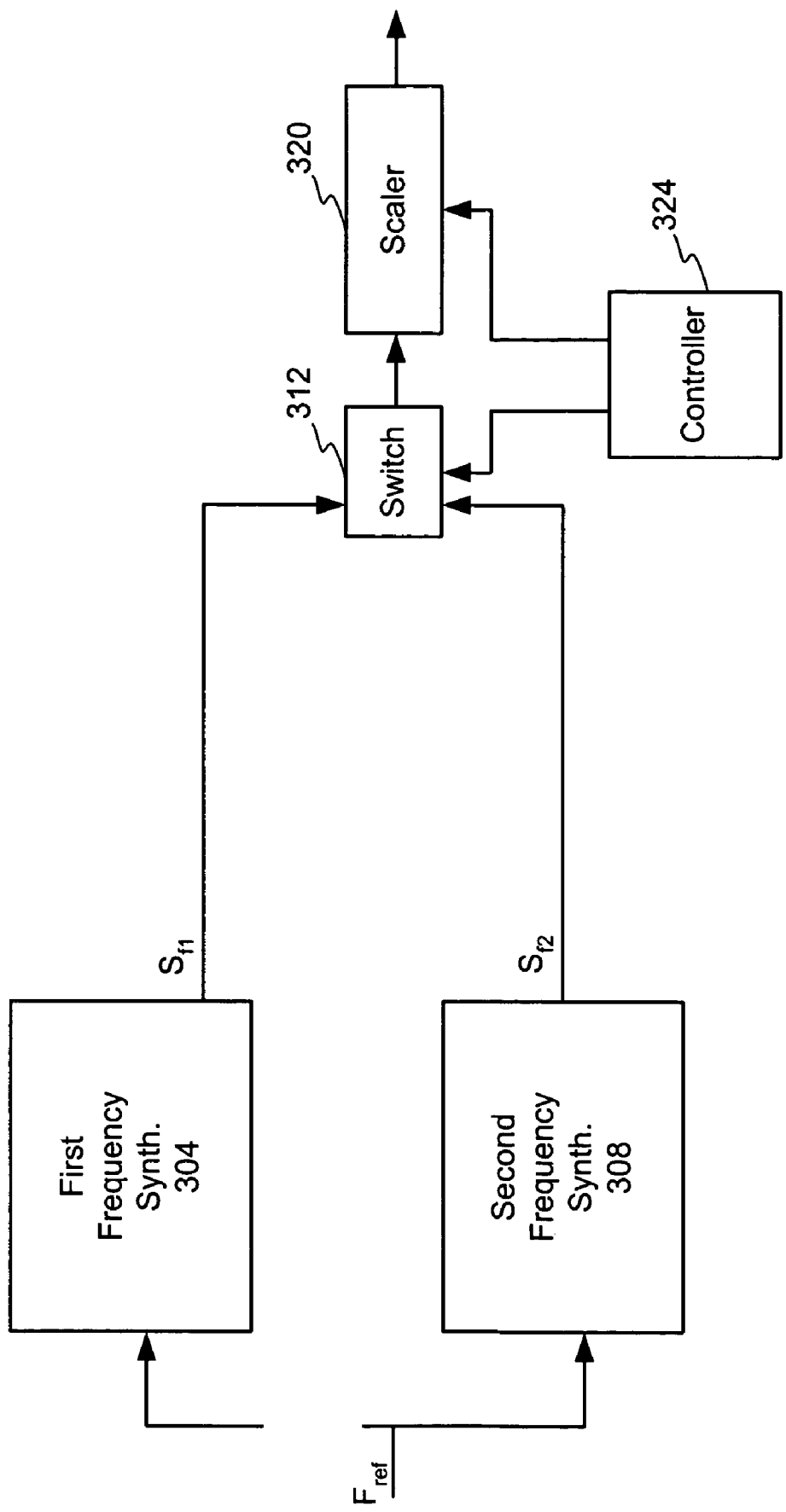
FIG. 3 illustrates an example embodiment of a dual synthesizer signal generator.

FIG. 3 illustrates an example embodiment of a dual-frequency signal generator. This is but one example embodiment and it is contemplated that other embodiments may be arrived at by one of ordinary skill in the art. As shown, a first frequency synthesizer 304 and a second frequency synthesizer 308 receive a signal at a reference frequency. The reference frequency may be generated in any manner known in the art including but not limited to a crystal, VCO, other type of oscillator, or any other source. Responsive to the signal at the reference frequency, the first frequency synthesizer 304 and the second frequency synthesizer 308 generate signals at different frequencies.

The first frequency synthesizer 304 and the second frequency synthesizer 308 may comprise hardware, software, or both configured to generate signals at the desired frequencies. The frequency synthesizers 304, 308 may comprise any means for generating the signals. In one embodiment the frequency synthesizers 304, 308 comprise phase-locked loops configured to generate a signal at a frequency that is multiple of reference frequency.

The output of the first frequency synthesizer 304 and the second frequency synthesizer 308 connect to a switch 312 configured to selectively output either the signal from the first frequency synthesizer 304 or the signal from the second frequency synthesizer 308. The switch output connects to a scaler 320, which may also be referred to as a frequency modification module. The switch 312 is responsive to a switch control signal generated by a controller 324. The controller 324 may comprise any type of control device including but not limited to control logic, a processor, a digital signal processor, one or more logic devices, ASIC, or any other type controller or processor. The controller 324 may be configured to utilize software code. Thus, responsive to the switch control signal from the controller 324, the switch 312 selectively outputs either the signal from first frequency synthesizer 304 or the signal from the second frequency synthesizer 308.

The scaler 320 comprises a frequency modification device configured to modify the frequency of either the signal from the first frequency synthesizer 304 or the signal from the second frequency synthesizer 308. In one embodiment the scaler 320 comprises a frequency multiplier, a frequency divider, or both configured to modify the frequency of a signal. It is also contemplated that the scaler 320 may comprise a mixer, any frequency conversion or translation device. The amount of modification or scaling done to a signal is generally in proportion or related to which signal is output by the switch 312.

In operation, the first frequency synthesizer 304 and the second frequency synthesizer 308 generate predetermined signals to which each synthesizer has been tuned. The reference frequency $F_{ref}$ may be used as a base frequency for use by the first frequency synthesizer 304 and the second frequency synthesizer 308. Thus, the frequency of the signal $S_{f1}$ from the first frequency synthesizer 304 and the signal $S_{f2}$ from the second frequency synthesizer 308 may be related to the reference frequency $F_{ref}$, such as a multiple or ratio.

In one embodiment the frequencies of the signals $S_{f1}$ and $S_{f2}$ are widely spaced to thereby prevent cross-contamination or interference between frequencies. In one embodiment the signals $S_{f1}$ and $S_{f2}$ are separated by greater than 6 MHz. In one embodiment the signals $S_{f1}$ and $S_{f2}$ are separated by greater than 30 kHz. In one embodiment the signals $S_{f1}$ and $S_{f2}$ are at frequencies that are related by non-integer multiples. For example, the ratio 1:2 and 1:3 are integer multiples whereas the multiple 1:1.5 is a non-integer multiple. Signals at non-integer multiples may be selected to reduce or minimize cross-coupling between signals and within the switch.

It is contemplated that the first frequency synthesizer 304 and the second frequency synthesizer 308 may be running and active at the same time and thus, operation at different frequencies or non-integer multiples reduces interference, such as EMI. As a further advantage, frequencies at non-integer multiples do not create overlapping harmonics. Such interference may be further reduced by subsequent processing and operation, which is described in detail below.

Responsive to the control signal from the controller 324, the switch selectively outputs either $S_{F1}$ or $S_{F2}$ to the scaler. Because the frequencies of $S_{F1}$ or $S_{F2}$ are related or separated as described above, the switch is able to provide adequate isolation between the inputs and the output is thus free or mitigated of cross-coupling, cross-contamination or EMI. Absent such frequency separation, the switch 312 may be unable to provide adequate separation. In one embodiment it is desired that the switch provide at least 60 dB of separation. In one embodiment it is desired that the switch provide at least 80 dB of separation. In one embodiment it is desired that the switch provide at least 20 dB of separation.

The scaler 320 modifies the frequency of the signal to the desired signal. Thus, it is contemplated that the signals $S_{F1}$ or $S_{F2}$ generated by the first frequency synthesizer 304 and the second frequency synthesizer 308 are not the final signal which will be output by the signal generator as shown in FIGS. 1 and 2. The frequency scaling performed by the scaler 320 allows the signals generated by the synthesizers 304, 308 to not be at the desired output frequency and thus, need not be closely related in frequency. As a result, use of signals at frequencies that cross-couple or with overlapping harmonics is minimized or eliminated. The output of the scaler 320 may be provided to mixers as shown in FIGS. 1 and 2 or any other device.

Figure 4:
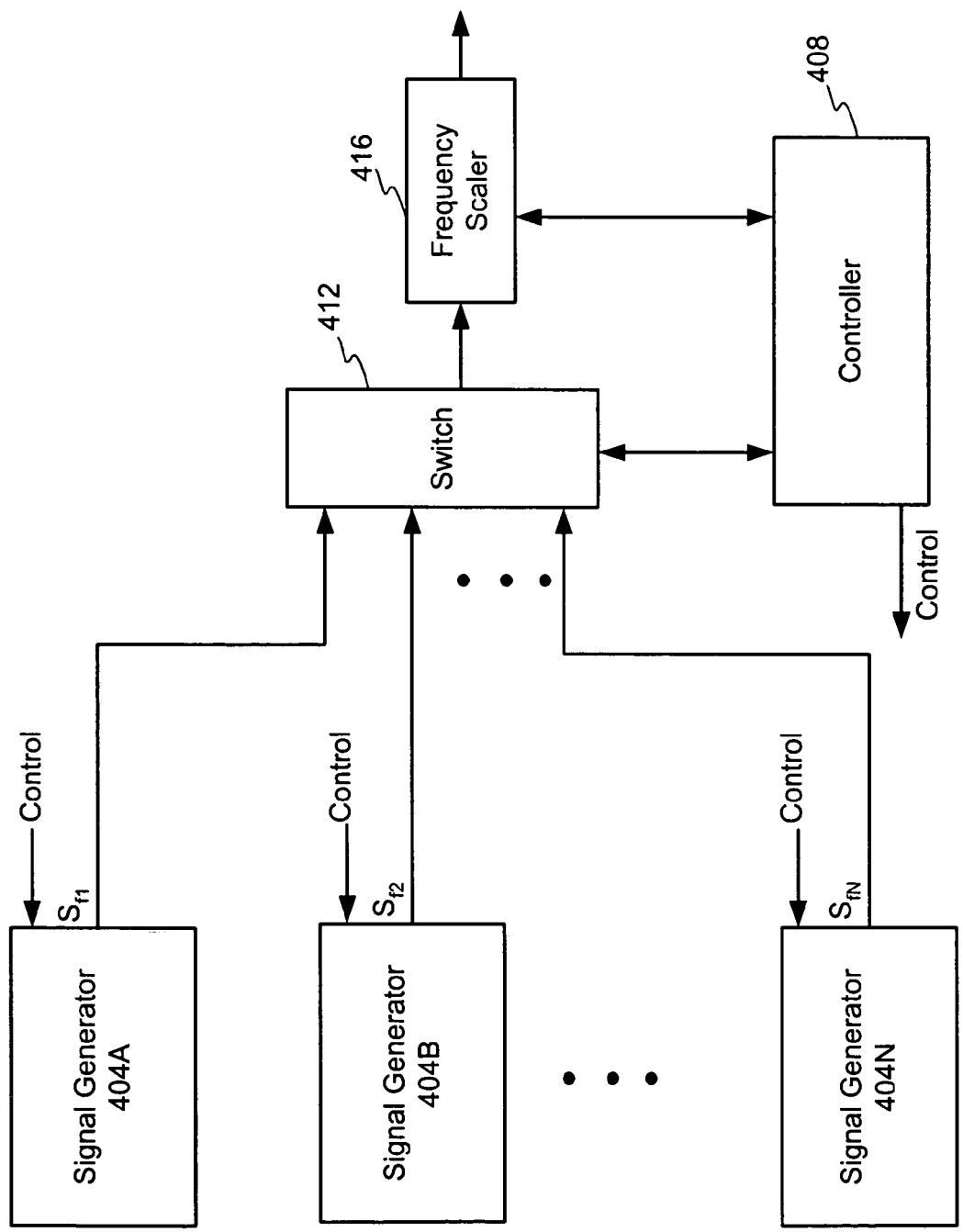
FIG. 4 illustrates a block diagram of an embodiment of the signal generator having two or more frequency synthesizers.

FIG. 4 illustrates a block diagram of an embodiment of the signal generator having two or more frequency synthesizers. The system of FIG. 4 shares numerous similarities with the system of FIG. 3 and as such, only the aspects that differ are discussed in detail. As shown in FIG. 4, two or more signal generators 404A-404N are configured to generate the signals $S_{f1}$, $S_{f2}$ through $S_{fN}$, where N is any whole number. The use of numerous signal generators 404 allows the system to generate additional frequencies.

As shown, at least one of the signal generators 404 receives a control signal that is generated by a controller 408. The controller 408 may be configured similar to the controller described above in FIG. 3. The control signal generated by the controller 408 may be used to control any aspect of the operation of the signal generators 404. It is contemplated that each signal generator may be configured to generate or synthesize more than one signal or frequency. In such an embodiment, the control signal may be used to identify or specify which of the two or more frequencies a signal generator will generate and output.

As shown, each signal generator 404 has an output connected to a multiple input switch 412. The term switch 412 as used herein may comprise any switching device, including but not limited to a multiplexer, RF switch, PIN diode, or any other switching device. The switch 412 receives a control signal from the controller 408 and the control signal determines which input signal the switch will provide as an output. It is desired that the switch 412 have isolation or separation between each input and between each input and the output to reduce cross-coupling.

The output of the switch 412 connects to a frequency scaler 416, which also receives a control signal from the controller 408. The control signals provided to the signal generators 404, switch 412, and scaler 416 synchronize operation of each device. Thus, when the switch 412 is controlled to provide the signal $S_{f1}$ from the signal generator 404A at a frequency $f_1$ to the frequency scaler, then concurrently, the control signal provided by the controller 408 to the scaler 416 forces the scaler to modify the frequency of the signal $S_{f1}$ by a matching scaling factor to thereby generate an output signal at a desired output frequency. It is contemplated that the scaling factor may increase or decrease the frequency of a received signal. The output from the scaler 416 may be further processed or provided directly to a receiver apparatus or transmitter apparatus, such as for example a mixer.

As an advantage of the method and apparatus shown in FIG. 4, one or more of the signal generators 404 may be configured to generate more than one frequency thereby expanding the frequency generating capacity of the system. This provides the advantage of increased capacity and capability of the system without needlessly duplicating circuitry.

Figure 5A:
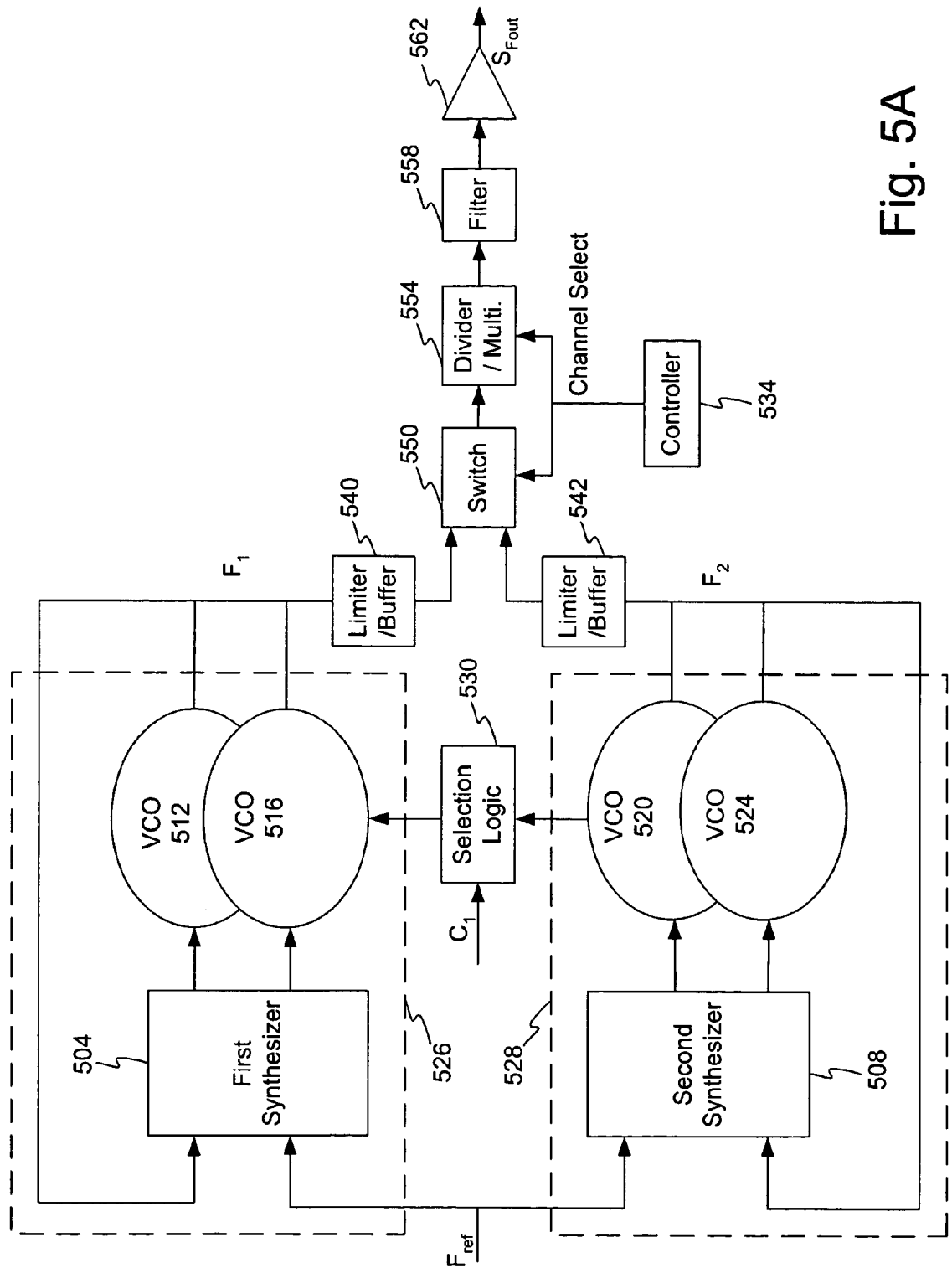
FIG. 5A illustrates a detailed block diagram of an example embodiment of a precision, high-agility frequency synthesizer.

Turning now to FIG. 5A, a detailed block diagram of an example embodiment of a precision, high-agility frequency synthesizer is shown. This is but one possible embodiment of a frequency synthesizer and as such, one of ordinary skill in the art may develop other alternative embodiments that do not depart from the scope of the claims that follow. In the embodiment of FIG. 5A, additional details are provided regarding the frequency synthesizer aspects of the system.

In this embodiment a reference frequency $F_{ref}$ may be generated by any source, such as a crystal or other clean source, and provided to a first frequency synthesizer 504 and a second frequency synthesizer 508. The synthesizers 504, 508 may comprise any device or system capable of generating an output signal at a particular voltage where the voltage is related to the reference frequency $F_{ref}$ or a voltage related to the difference in frequency between a feedback signal and reference frequency $F_{ref}$. In one embodiment the synthesizers 504, 508 comprise one or more of a phase detector, frequency multiplier or divider, or charge pumps. It is also contemplated that the synthesizers 504, 508 may comprise pre-scalers and/or fractional modulators. It is contemplated that the synthesizers 504, 508 may generate more than one particular frequency or generate a single frequency.

The first synthesizer 504 connects to one or more voltage controlled oscillators (VCO) 512, 516 while the second synthesizer 508 connects to one or more voltage controlled oscillators 520, 524. The apparatus within the dashed lines 526, 528 may be referred to as a first phase locked loop (PLL) synthesizer 526 and a second PLL synthesizer 528. Although two PLLs 526, 528 are shown, it is contemplated that any number of PLLs or signal generators may be provided. As such, the output of the VCOs 512, 516 is fed back to the first synthesizer 504 while the outputs of VCOs 520, 524 are fed back into the second synthesizer 508. Based on these feedback signals the synthesizers 504, 508 control the voltage level provided to the VCOs 512, 516, 520, 524 to thereby control the frequency of the signals output from the VCO's.

The VCOs 512, 516, 520, 524 also receive a control signal from selection logic 530 that is configured to selectively activate one or more of the VCOs in either of the first PLL 526 and/or the second PLL 528. It is contemplated that the first PLL 526 and the second PLL 528 contain multiple VCO and associated apparatus, and thus may be tuned to different frequencies responsive to input from the selection logic 530. It is contemplated that the selection logic may receive an input $C_1$ from a controller 534. In one embodiment the selection logic tunes the VCO to bring it precisely to the desired frequency.

Figure 6:
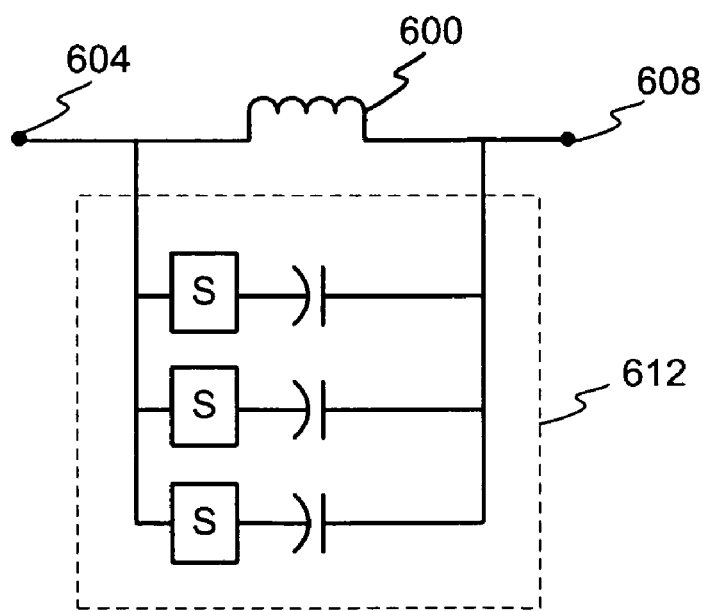
FIG. 6 illustrates an example embodiment of a tuning bank.

In one embodiment the selection logic 530 comprises a capacitor bank with associated switching apparatus that received a control signal $C_1$ from a controller 534. FIG. 6 illustrates an example embodiment of a tuning bank. As shown, a tuning inductor 600 connects to a first node 604 and a second node 608. A bank 612 of switched capacitors also connects to the first node 604 and the second node 608. In this example embodiment, a control signal is provided to the switches S to selectively integrate the capacitors of the capacitor bank 612 into the circuit. This in turn can be used to tune the frequency of a PLL or signal generator to a precise frequency.

Returning to FIG. 5A, the outputs from the PLL synthesizers 526, 528 feed into limiter or buffer 540, 542 as shown. The limiters or buffers 540, 542 perform signal processing or filtering on the signal to convert or modify the received signals to a format that reduces electromagnetic coupling between signals. In one embodiment a limiter is utilized and configured to receive and convert a sinusoidal signal into a square wave signal or a signal resembling a square wave signal by peak limiting a signal. The limiter may be configured in any manner to process a received sinusoidal signal into a square wave signal. Use of a square wave signal may reduce electromagnetic (EM) coupling and phase distortion as compared to a sinusoidal signal.

Figure 5B:
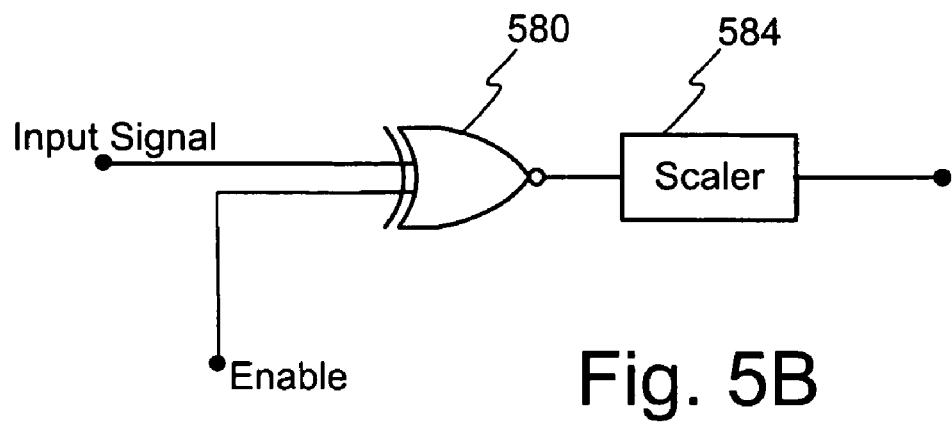
FIG. 5B illustrates a block diagram of an example embodiment of a divider or multiplier circuit.

In one embodiment a divider or multiplier circuit may be configured to receive the output of the VCOs 512, 516, 520, 524 and it may be configured to reduce harmonics and reduce circuit complexity. Thus, the devices 540, 542 may comprise a limiter, a buffer, a multiplier, or a divider, or some combination thereof. As can be appreciated it is possible to place the components shown in FIG. 5A in different arrangements without departing from the scope of the claim and that some elements may be omitted. FIG. 5B illustrates a block diagram of an example embodiment of a divider or multiplier circuit. Thus it is contemplated that other configurations for a divider or multiplier circuit other than that shown in FIG. 5B are possible. As shown a signal input connects to a logic device 580, which in this embodiment comprises an XNOR device. An enable signal is also provided to the logic device 580 to selectively enable operation of the device. The output of the logic device 580 feeds into a scaler 584, which is configured to modify or tune one or more aspects of the logic device output. The scaler 584 may be configured to modify the magnitude, frequency, phase, or any other aspects of the logic device output.

Returning now to FIG. 5A, in one embodiment the resulting output of the limiter or buffer 540, 542 comprises a digital signal. It is contemplated that the signals provided to the limiter or buffer 540, 542 are signals at different frequencies and likewise, the outputs from the limiters are different frequencies. Other forms of limit processing, tailored to reduce cross-coupling, may occur. It is further contemplated that in addition to the embodiment shown in FIG. 5, the limiter or buffer 540, 542 may be located after the switch 550 instead of before the switch. In certain embodiments this may further reduce cross coupling or generation of unwanted harmonics. In addition, it is also contemplated that the limiter or buffer 540, 542 may be arranged in any combination either before the switch 550, after the switch, or both depending on the particular system design. It is further contemplated that with regard to certain embodiments and certain signal frequencies, use of a limiter or buffer 540, 542 may be entirely avoided which in turn may in some instances reduce generation of harmonics or cross coupling.

The outputs of the limiter or buffer 540, 542 connect to a switch 550 that is configured to output either input responsive to a control signal from the controller 534. A control signal from the controller 534 is also provided to a divider/multiplier 554. The divider/multiplier 554 changes the frequency of the signal output by the switch 550 to thereby scale the frequency upward or downward to generate a signal at the desired output frequency. The divider/multiplier 554 may comprise one or more counters, digital circuits, control logic, flip-flops, mixers or any other device or combination that is configured to modify the frequency of a received signal.

A filter 558 cleans or otherwise modifies the divider/multiplier 554 output signal to generate a signal that is in turn provided to an amplifier 562. The amplifier 562 may adjust the magnitude of the signal and the output impedance of the signal generator to match the needs of subsequent circuits. In one embodiment the filter 558 transforms the digital signal from the limiters 540, 542 back to an analog signal.

The method and apparatus described herein has numerous advantages over systems of the prior art. As a result, a low noise, highly agile, cost effective, frequency synthesizer is provided that is capable of rapidly generating signals at a desired frequencies. In addition, cross-coupling is minimized. One advantage resulting from the method and apparatus describe herein is a reduction or elimination of EM coupling and cross contamination of signals generated by the first PLL 526 and the second PLL 528. In systems of the prior art this was a significant problem. In one embodiment this problem is eliminated or reduced by forcing the first PLL 526 and the second PLL 528 to generate signals, $F_1$ and $F_2$ in FIG. 5A, at frequencies that do not interfere, couple or generate cross-EMI. As described above in more detail, this may occur by spacing the frequencies of these signals sufficiently apart to minimize cross-coupling at the frequencies of interest, establishing the frequencies $F_1$ and $F_2$ at non-integer multiples, or both.

Another advantage over prior art systems is use of a limiter or buffer 540, 542 to transform or process the signal to minimized cross-coupling within the switch 550. As a result of these mitigating factors it is contemplated that a less expensive switch may be utilized, such as for example, an integrated circuit switch may be utilized.

Because frequencies $F_1$, $F_2$ are not at the final desired output frequency and not closely related, the divider/multiplier 554 modifies these signals to thereby generate a signal at the final frequency $S_{fout}$ (see FIG. 5A). It is contemplated that since the final desired frequency $f_{out}$ is different from $F_1$ and $F_2$, the cross-coupling is further reduced or eliminated. Moreover, related frequencies are not presented to the switch 550 which in turn prevents cross-coupling within the switch, which is where cross-coupling can easily occur.

Yet another advantage is that the controller 534 synchronizes operation of the entire system thereby providing a dedicated location for control of the system. Thus, the controller 534 synchronizes the selection logic 530 to tune the PLLs 526, 528 to the desired frequencies while also controlling the switch 550 to output the proper signal and the divider/multiplier 554 to apply the proper frequency adjustment or scaling to generate the desired output signal at the output frequency.

Another advantage is that each PLL 526, 528 may generate a signal that at different times possesses a different frequency. Because each PLL 526, 528 may generate a different frequency, a fewer number of PLLs may be utilized thereby reducing space requirements and cost.

The method and apparatus described herein also has the advantage of rapid generation of signals at different frequencies. It is contemplated that the PLL 526, 528 may be both operational at the same time but generating signals of different frequencies. When a request for a signal is received by the controller 534 or generated by the controller 534, the switch 550 may quickly switch the output to the alternate switch input to thereby rapidly change the frequency of the output signal $S_{fout}$. In this manner the second, or other, PLL may be tuned to the alternate frequency, settle to that frequency, and that signal can be ready for routing by the switch to the output amplifier 562. Another advantage over the prior art is that the need for an RF shield is eliminated or significantly reduced, and most of the functions and circuits can be integrated on an IC (integrated circuit) thereby reducing cost and size.

Figure 7A:
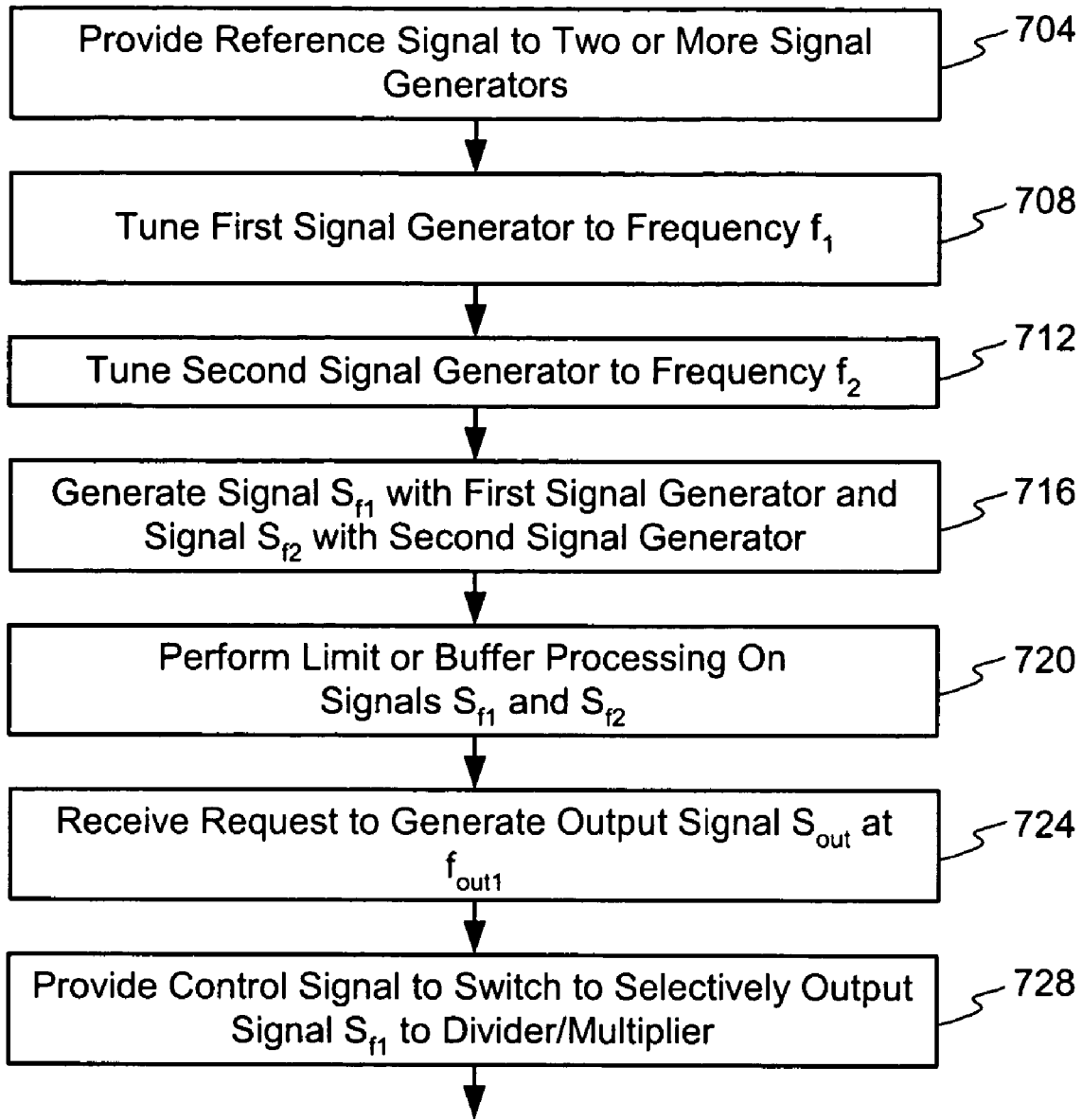
FIGS. 7A and 7B illustrates an operational flow diagram of an example method of operation of an example embodiment of the invention.
Figure 7B:
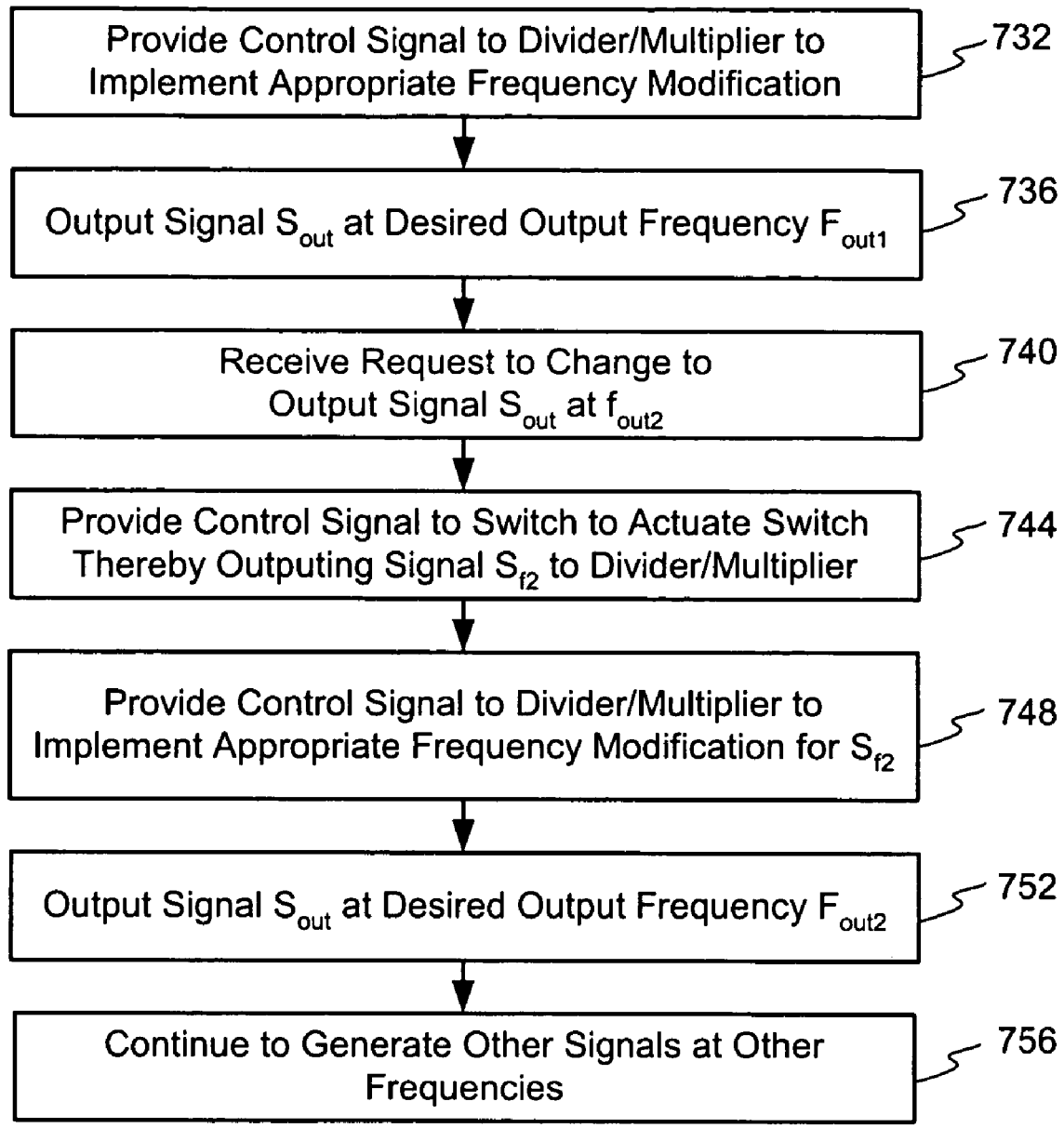

With these advantages in mind, an exemplary method of operation is shown and described. FIGS. 7A and 7B illustrate an operational flow diagram of an example method of operation of an example embodiment of the invention. To aid in understanding, the method of FIGS. 7A and 7B is described with reference to the system of FIG. 5A. Of course, a method may be practiced that omits some of the steps of FIG. 7, but which does not depart from the claims that follow. In this method of operation it is desired to generate an output signal $S_{out}$ that may vary in frequency between frequencies $F_{out1}$ and $F_{out2}$. At a step 704, the operation provides a reference signal to two or more signal generators. The signal generators use the reference signal as a guide or starting point for frequency syntheses. At a step 708, the operation tunes a first signal generator to a frequency $F_1$ while at a step 712 a second signal generator is tuned to generate a signal at a frequency $F_2$. The frequencies $F_1$ and $F_2$ may be different than frequencies $F_{out1}$ and $F_{out2}$, or at least one of the frequencies $F_1$ and $F_2$ may be the same as one of the frequencies $F_{out1}$ and $F_{out2}$.

It is contemplated that the frequencies $F_1$ and $F_2$ are selected to minimize cross-coupling between signals. As described above, in one embodiment this is achieved by spacing frequencies $F_1$ and $F_2$ substantially away from each other and from the desired output signal frequencies. In one embodiment $F_1$ and $F_2$ are non-integer multiples of each other. In one embodiment $F_1$ and $F_2$ are non-integer multiples of each other and of $F_{out1}$ and $F_{out2}$.

At a step 716, the signal generators create signals $S_{f1}$ and $S_{f2}$ at frequencies $f_1$ and $f_2$. These signals are provided, at a step 720, to limiters, buffers or filters that modify the signals $S_{f1}$ and $S_{f2}$ to reduce cross-coupling. In one embodiment the limiters or filters transform the signals $S_{f1}$ and $S_{f2}$ to square wave signals. In one embodiment the processing by the limiters or buffer occurs after the switch.

At a step 724 the system may receive a request or generate a request to output a signal $S_{out}$ at a frequency $F_{out1}$. This may be in response to a request to change communication channels or for any other reason. Accordingly at a step 728 the controller or other device provides a control signal to the switch to cause the switch to output $S_{f1}$ to the divider/multiplier. As defined above, the term switch is defined to mean any switching device, including but not limited to a multiplexer, RF switch, PIN diode, or any other switching device.

At a step 732, a controller or other device provides a control signal to the divider/multiplier to implement appropriate frequency modification on the signal $S_{f1}$ to thereby create the desired output signal $S_{out}$ at a frequency $F_{out1}$. The divider/multiplier changes the frequency of the signal received from the switch which in turn allows the signals generated by the signal generators to be at diverse frequency, which in turn prevents cross-coupling between the signals and within the switch. Absent the divider/multiplier the signal generators may be required to generate signals at almost identical frequencies, which would in turn lead to unwanted cross-coupling that may render the system unusable. Thereafter, the signal $S_{out}$ at a frequency $F_{out1}$ is output from the system to subsequent components for subsequent processing of filtering or is output directly to a communication system or other device.

At a step 740, the system receives or generates a request to rapidly change the output signal $S_{out}$ to a different frequency, in this example embodiment to $F_{out2}$. In response to this request, at a step 744, the system sends a control signal to the switch to force the switch to output $S_{f2}$ instead of $S_{f1}$. Likewise, at a step 748 the controller sends a control signal to the divider/multiplier to alter the scaling to the signal $S_{f2}$ to create an output signal $S_{out}$ at a frequency $F_{out2}$. At a step 752 this signal may then be output from the system or subject to additional processing prior to being output. It is contemplated that optionally, at a step 756, the system may output other signals at other frequencies as would be desired for system operation and as designed into the signal generators, switch, and frequency modification devices. Any number of frequencies could be generated.

As a result of the second signal generator being pre-tuned to and having the signal $S_{f2}$ generated and presented to the switch, the system may rapidly change the frequency of the output signal. Without having an alternative signal at the desired signal ready for switching the PLL may have to tune to the new signal frequency and allow the loop to reach the desired frequency. It is contemplated that the speed may thus be limited only by the switch speed. In other methods of operation, each signal generator may generate a signal at more than one frequency and responsive to a control signal each signal generator may be pre-tuned to a desired frequency such that upon receiving a request for an output signal at a different frequency the system may rapidly respond to the request.

The various embodiments shown in the figures and described above include numerous features, elements and methods of operation. It is fully contemplated that the various elements and methods of operation may be embodied or combined in any combination, either separately, or in conjunction with any other element as disclosed herein or as understood by one of skill in the art.

While various embodiments of the invention have been described, it will be apparent to those of ordinary skill in the art that many more embodiments and implementations are possible that are within the scope of this invention.

What is claimed is:

1. A method for rapidly generating a signal at an output frequency for use in a communication device comprising: providing a reference signal at a reference frequency to a first signal synthesizer configured to generate a first signal at a first frequency; generating the first signal with the first signal synthesizer; processing the first signal to reduce harmonic cross-coupling thereby creating a processed first signal; providing the reference signal at the reference frequency to a second signal synthesizer configured to generate a second signal at a second frequency; generating the second signal with the second signal synthesizer; processing the second signal to reduce harmonic cross-coupling thereby creating a processed second signal; providing the processed first signal and the processed second signal to a switch; responsive to a control signal; selectively switching the switch to output from the switch either the processed first signal or the processed second signal to create a switch output signal; after switching either the processed first signal or the processed second signal from the switch and for every switching by the switch, changing the setting of a frequency modification module to shift the frequency of the switch output signal to thereby generate a frequency specific signal at a different frequency; and outputting the frequency specific signal on a single output without the frequency specific signal passing through any switches after the shifting of the frequency, wherein selectively switching the switch to output from the switch either the processed first signal or the processed second signal is the only switching when producing the frequency specific signal.

2. The method of claim 1, wherein the first signal synthesizer and the second signal synthesizer comprises phase locked loops or delay locked loops.

3. The method of claim 1, wherein processing the first signal and the second signal to reduce harmonic cross-coupling comprises limit or buffer processing.

4. The method of claim 3, wherein limit or buffer processing comprises converting a sinusoidal signal to a signal more closely resembling a square wave signal.

5. The method of claim 1, wherein shifting comprises modifying the frequency of the signal output from the switch in proportion to the ratio of the output frequency to either the first frequency or the second frequency.

6. The method of claim 1, further comprising one or more additional signal synthesizers configured to generate one or more additional signals at one or more additional frequencies.

7. The method of claim 1, wherein the first signal synthesizer and the second signal synthesizer generate signals at frequencies in addition to the first frequency and the second frequency.

8. A method for generating an output signal at one or more output frequencies comprising: generating a first signal at a first frequency; generating a second signal at a second frequency; limit processing at least one of the first signal and the second signal to reduce cross-coupling to generate one or more limit processed output signals; providing the one or more limit processed output signals to a switch; selectively outputting, based on switch operation, at least one limit processed output signal received from the switch to a frequency modification module; for each and every switch operation changing the setting of the frequency modification module to shift the frequency of the switch output signal to thereby generate a frequency modified signal; and outputting the frequency modified signal on a single output and wherein the switch is the only switch in producing the frequency modified signal.

9. The method of claim 8, wherein the first frequency and the second frequency are non-integer multiples.

10. The method of claim 8, wherein limit processing comprises converting a sinusoidal type signal to a square wave signal.

11. The method of claim 10, wherein the limiting function comprises converting a sinusoidal signal to a signal resembling a square wave signal.

12. The method of claim 8, wherein the frequency modification module does not modify the frequency of both the first signal and the second signal.

13. The method of claim 8, wherein the frequency modification module modifies the frequency of the first signal by an amount different than the amount of modification to the frequency of the second signal or a limit processed version of the second signal.

14. A system for generating an output signal, wherein the output signal is capable of being switched between two or more output frequencies, the system comprising: two or more signal generators configured to generate two or more signals, wherein each signal is at a different frequency; one or more multiplier, dividers, or both configured to receive at least one of the two or more signals and process the at least one signal to create a first signal at a first frequency or a second signal at a second frequency such that the second frequency is a non-integer multiple of the first signal; a switch configured to receive at least two signals of the two or more signals and responsive to a control signal output a switch output comprising one of the two or more signals; and a frequency modification device configured to receive the switch output after switching and modify the frequency of the switch output signal to create a frequency modified signal, wherein for every change in the switch output the setting of the frequency modification device also changes to shift the frequency of the switch output signal to thereby generate the frequency modified signal, wherein an additional switch is not present after the frequency modification device and the system utilizes only one switch.

15. The system of claim 14, wherein the two or more signal generators generate signals that are at frequencies that are non-integer multiples.

16. The system of claim 14, further comprising a controller configured to generate one or more control signals wherein the control signals synchronize switch output with frequency modification device operation and such synchronization forces a change in the frequency modification for every change in switch output.

17. The system of claim 14, wherein the different frequencies of the two or more signals are selected to minimize cross-coupling between the two or more signals.

18. The system of claim 14, wherein the amount of frequency modification performed on a signal is directly proportional to the frequency of a signal and a desired output frequency.

19. The system of claim 14, further comprising a limiter configured to modify the two or more signals prior to switching to reduce cross-coupling between the two or more signals within the switch.

20. The system of claim 19, wherein two or more signals generated by the two or more signal generators comprise non-square wave signals and the limiter converts a signal to format more closely approaching a square wave signal.

21. The system of claim 14, wherein the output signal is for use as a local oscillator signal in a wireless communication device.

22. A system for rapidly switching the frequency of an output signal between a third frequency and a fourth frequency comprising: a switch configured to receive a first signal at a first frequency and a second signal at a second frequency and responsive to a control signal output either of the first signal or the second signal; a frequency modification device configured to, responsive to a control signal, increase or decrease the frequency of a signal output from the switch to either the third frequency or the fourth frequency wherein for every change in switch output, the setting of the frequency modification device changes to increase or decrease the frequency of the switch output signal to thereby generate a frequency modified signal; and a controller configured to provide a control signal to the switch and the frequency modification device to thereby synchronize which signal is output from the switch with frequency modification device operation; an output configured to output the frequency modified signal, and wherein the switch is the only switch in the system.

23. The system of claim 22, wherein the frequency modification device comprises a frequency multiplier configured to multiply a received signal by a value necessary to modify the frequency of the received signal to either the third frequency or the fourth frequency.

24. The system of claim 22, further comprising one or more limiters configured to modify at least one input to the switch to thereby reduce cross-coupling between the first signal and the second signal.

25. The system of claim 22, wherein the first frequency and the second frequency are selected to reduce cross-coupling between signals and the system is embodied in an integrated circuit.

26. The system of claim 22, wherein the ratio between the first frequency and the second frequency is a non-integer value.

27. The system of claim 22, further comprising at least one signal generator configured to generate the first signal, the second signal, or both, and
wherein the controller is further configured to provide a control signal to at least one signal generator to control which frequency is generated.

* * * * *